United States Patent [19]

Davis et al.

[11] Patent Number: 4,979,122
[45] Date of Patent: Dec. 18, 1990

[54] APPARATUS AND METHOD FOR MONITORING POWER

[75] Inventors: Richard K. Davis, Crozet; Keith W. Curtin, Charlottesville, both of Va.

[73] Assignee: GE Fanuc Automation North America Inc., Charlottesville, Va.

[21] Appl. No.: 304,530

[22] Filed: Feb. 1, 1989

[51] Int. Cl.[5] ........................ G06F 15/56; G06F 15/74
[52] U.S. Cl. .................................. 364/483; 324/76 R; 364/481; 364/492
[58] Field of Search ............... 364/200, 900, 481, 483, 364/484, 486, 487, 492; 324/76 R, 78 R, 102, 500; 361/18, 20, 23, 30, 35, 62, 79, 90; 341/122–125

[56] References Cited

U.S. PATENT DOCUMENTS

| 4,388,611 | 6/1983 | Haferd | 364/487 |
| 4,498,138 | 2/1985 | Moore | 364/483 |
| 4,535,409 | 8/1985 | Jindrick et al. | 364/481 |
| 4,541,058 | 9/1985 | Andow et al. | 364/483 |
| 4,672,555 | 6/1987 | Hart et al. | 364/483 |
| 4,758,963 | 7/1988 | Gordon et al. | 364/481 |
| 4,773,022 | 9/1988 | Melville et al. | 364/487 |
| 4,803,635 | 2/1989 | Andow | 364/481 |
| 4,809,189 | 2/1989 | Batson | 364/487 |
| 4,827,369 | 5/1989 | Saletta et al. | 364/483 |

FOREIGN PATENT DOCUMENTS 0063402 10/1982 European Pat. Off. .
8303011 9/1983 PCT Int'l Appl. .
1578174 11/1980 United Kingdom .

Primary Examiner—Kevin J. Teska
Attorney, Agent, or Firm—James H. Beusse

[57] ABSTRACT

A power monitor, for determining real and imaginary power associated with one or more line signals, samples a plurality of line cycles during an observation window to generate a plurality of voltage-current sample sets for each line cycle. The sampling of the sample sets is timed such that the voltage-current sample sets are taken at different relative time positions. The power monitor stores incoming voltage-current sample data in one memory area and concurrently analyzes sample data already stored in another memory area. Deletion of sample data is not permitted until transient analysis of such data is complete.

In another embodiment, the power monitor includes a working data memory area coupled to the sampling circuitry such that the sample sets occurring during each observation window are stored in the working data memory area in interleaved fashion to simulate a single cycle of data. This power monitor further includes a transient data area, coupled to the sampling circuitry, for storing the sample sets occurring during an observation window in a non-interleaved or sequential fashion. Power analysis is conducted on the sample sets in the working data memory area unless a power transient is sensed. Upon sensing a transient, data from the transient data area is provided for analysis.

32 Claims, 8 Drawing Sheets

| C | B | A | | |
|---|---|---|---|---|
| 0 | 0 | 0 | ADDRESS 1 | FDI (1) |
| 0 | 0 | 1 | ADDRESS 2 | FDI (2) |
| 0 | 1 | 0 | ADDRESS 3 | FDI (3) |
| 0 | 1 | 1 | ADDRESS 4 | FDI (4) |
| 1 | 0 | 0 | ADDRESS 5 | FDI (5) |
| 1 | 0 | 1 | ADDRESS 6 | FDI (6) |
| 1 | 1 | 0 | ADDRESS 7 | FDI (7) |
| 1 | 1 | 1 | ADDRESS 8 | FDI (8) |

| INPUT CYCLE # | SAMPLES PER CYCLE -CUMULATIVE |
|---|---|
| 1 | 14.22 |
| 2 | 28.44 |
| 3 | 42.67 |
| 4 | 56.89 |
| 5 | 71.11 |
| 6 | 85.33 |
| 7 | 99.56 |
| 8 | 113.78 |
| 9 | 128.00 |

```
         SAMPLING ORDER            STORAGE ORDER          J

SS1   SAMPLE  1, CYCLE 1        LOCATION 1             1
   SS2   SAMPLE  2, CYCLE 1        LOCATION 9             2
   SS3   SAMPLE  3, CYCLE 1        LOCATION 17            3
   SS4   SAMPLE  4, CYCLE 1        LOCATION 25            4
   SS5   SAMPLE  5, CYCLE 1        LOCATION 33            5
   SS6   SAMPLE  6, CYCLE 1        LOCATION 41            6
   SS7   SAMPLE  7, CYCLE 1        LOCATION 49            7
   SS8   SAMPLE  8, CYCLE 1        LOCATION 57            8
   SS9   SAMPLE  9, CYCLE 1        LOCATION 65            9
   SS10  SAMPLE 10, CYCLE 1        LOCATION 73           10
   SS11  SAMPLE 11, CYCLE 1        LOCATION 81           11
   SS12  SAMPLE 12, CYCLE 1        LOCATION 89           12
   SS13  SAMPLE 13, CYCLE 1        LOCATION 97           13
   SS14  SAMPLE 14, CYCLE 1        LOCATION 105          14
   SS15  SAMPLE 15, CYCLE 1        LOCATION 113          15
   SS16  SAMPLE 16, CYCLE 1        LOCATION 121          16
   SS17  SAMPLE  1, CYCLE 2        LOCATION 2            17
   SS18  SAMPLE  2, CYCLE 2        LOCATION 10           18
   SS19  SAMPLE  3, CYCLE 2        LOCATION 18           19
     •        •                        •                  •
     •        •                        •                  •
     •        •                        •                  •

SS33  SAMPLE  1, CYCLE 3        LOCATION 3             •
   SS34  SAMPLE  2, CYCLE 3        LOCATION 11            •
   SS35  SAMPLE  3, CYCLE 3        LOCATION 19            •
     •        •                        •                  •
     •        •                        •                  •
     •        •                        •                  •

SS113 SAMPLE  1, CYCLE 8        LOCATION 8             •
   SS114 SAMPLE  2, CYCLE 8        LOCATION 16            •
   SS115 SAMPLE  3, CYCLE 8        LOCATION 24            •
     •         4, CYCLE 8          LOCATION 32            •
     •         5, CYCLE 8          LOCATION 40            •
     •         6, CYCLE 8          LOCATION 48            •
     •         7, CYCLE 8          LOCATION 56            •
     •         8, CYCLE 8          LOCATION 64            •
     •         9, CYCLE 8          LOCATION 72            •
     •        10, CYCLE 8          LOCATION 80            •
     •        11, CYCLE 8          LOCATION 88            •
     •        12, CYCLE 8          LOCATION 96            •
     •        13, CYCLE 8          LOCATION 104           •
     •        14, CYCLE 8          LOCATION 112           •
     •        15, CYCLE 8          LOCATION 120           •
   SS128 SAMPLE 16, CYCLE 8        LOCATION 128          128
```

*FIG. 12*

APPARATUS AND METHOD FOR MONITORING POWER

BACKGROUND OF THE INVENTION

This invention relates in general to the measurement of power system parameters in electric utility and industrial applications. More particularly, the invention relates to a power monitor for determining the voltage, current and power associated with one or more power lines or other conductive paths.

BRIEF SUMMARY OF THE INVENTION

The nature of power line measurements is often such that a plurality of input parameters must be available to calculate the power being drawn by a particular load as well as the power factor (or efficiency) at which power is being delivered to the load. In modern industrial applications, it is common to employ three phases of power to deliver electrical energy to a factory or other high power user. To accurately measure the power being delivered to such a site, at least two input parameters, namely voltage and current, must generally be available for each of the phases. Thus, in the above three phase application, a total of 6 input parameters plus a parameter representative of the neutral must be available to enable power calculations. Both "in line" and "clamp-on" sensors are commercially available to enable sensing of voltage and current in each of the phases. Mechanical and electromechanical power monitors or power meters have been known for quite some time.

One object of the present invention is to provide an electronic power monitor which is capable of determining the WATTS (real power) and VARS (volt-amps reactive) associated with a particular power line.

Another object of the present invention is to provide an power monitor in which the speed requirement on the data acquisition circuitry contained therein is relatively low.

Yet another object of the present invention is to provide a power monitor which collects a data base of waveform information for the purpose of conducting waveform analysis.

In one embodiment of the invention, a power monitor is provided for monitoring the power associated with a periodic signal. The power monitor includes a sampling circuit for sampling the signal during an observation window including a plurality of cycles of the signal to generate a plurality of voltage-current sample sets. The power monitor further includes a timing circuit, coupled to the sampling circuit, for timing the sampling of the signal such that the voltage-current sample sets are distributed in time at different time positions from cycle to cycle within the observation window relative to the beginning of each cycle.

In another embodiment of the invention, a power monitor is provided for monitoring the power of a line signal over a plurality of observation windows. Each observation window includes a predetermined number of cycles of the line signal. The power monitor includes first, second and third memory areas. The power monitor further includes a sampling circuit for sampling the voltage and current of the line signal over a plurality of observation windows to generate incoming sample data. The power monitor alternatingly stores incoming sample data in the first and second memory areas during respective sequential observation windows. The monitor includes a microprocessor, coupled to the first, second and third memory areas, for performing power analysis on the sample data stored in the first memory area while incoming sample data is being stored in the second memory area. Subsequently, the microprocessor performs power analysis on the sample data stored in the second memory area while incoming sample data is being stored in the first memory area. The power monitor includes a transient sensing routine or equivalent hardware for determining if sample data in a present observation window contains transient data and, if so, causes incoming sample data in the next observation window following the present observation window to be stored in the third memory area.

A preferred embodiment of the invention is provided in which a power monitor monitors the power associated with a periodic signal. The monitor includes a sampling circuit for sampling the signal during an observation window including a plurality of cycles of the signal to generate a plurality of voltage-current sample sets. Each sample set contains at least one voltage sample and at least one current sample taken substantially at the same time. The power monitor further includes a timing circuit, coupled to the sampling circuit, for timing the sampling of the signal by the sampling circuit such that the voltage-current sample sets are distributed throughout each cycle of the observation window. A working data memory area is coupled to the sampling circuit for storing the sample sets occurring during an observation window in interleaved fashion to simulate a single cycle of data. A transient data area is coupled to the sampling circuit for storing the sample sets occurring during an observation window in sequential fashion. A transmit data area is coupled to the working data area and the transient data area. The transmit data area stores the contents of a selected one of the working data memory area and the transient data memory area as instructed by a host or other device in preparation for transmission of the data thus stored in the transmit data memory area to another location.

The features of the invention believed to be novel are specifically set forth in the appended claims. However, the invention itself, both as to its structure and method of operation, may best be understood by referring to the following description and accompanying drawings.

BRIEF DESCRIPTION OF THE DRAWINGS

FIG. 12 is a memory map of the data contained in the working data buffer and the transient data buffer of the power monitor of FIG. 11;

DETAILED DESCRIPTION OF THE INVENTION

I. A First Embodiment Of The Invention

Figures 1, 2:
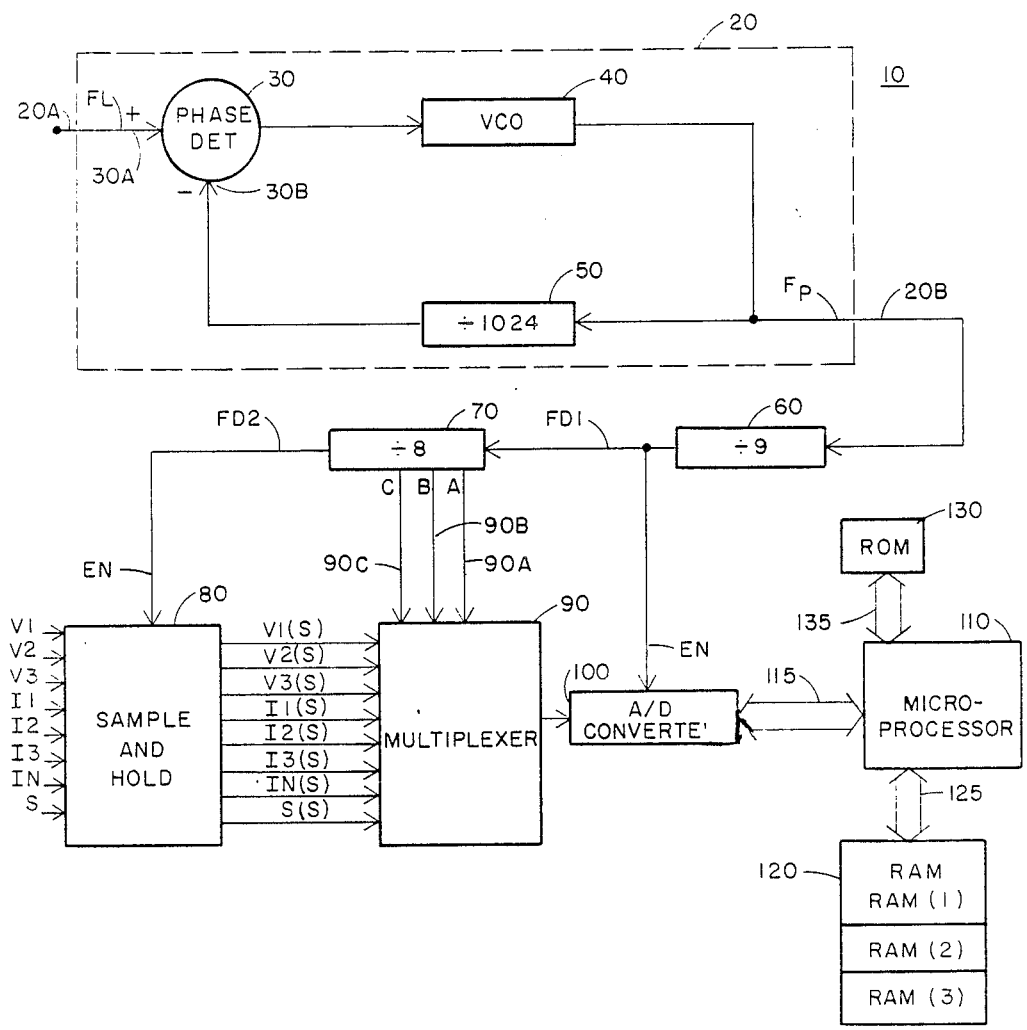
FIG. 1 is a block diagram of the power monitor of the present invention.
FIG. 2 is an address map of the addresses which are generated by the address generator/divider circuit of the power monitor.

FIG. 1 shows a block diagram of the power monitor of the present invention as power monitor 10. Although the embodiment of the power monitor shown in FIG. 1 is capable of monitoring power parameters in a three phase system, those skilled in the art will appreciate that the power monitor may be used to monitor a lesser number of phases as well. As will be explained in more detail subsequently, power monitor 10 samples the line input signal over an observation window including several cycles of the line input signal. Power monitor 10 takes several voltage-current sample sets during each cycle of the observation window, each sample set including at least one voltage sample and at least one current sample taken substantially at the same time.

In more detail, power monitor 10 includes a phase lock loop (PLL) 20 which acts as a frequency multiplier to produce a high frequency clock signal for use in sampling data sensed by monitor 10 in a manner later described. PLL 20 includes an input 20A and an output 20B. A substantially periodic line frequency signal, exhibiting a line frequency, $F_L$, of 50 Hz, 60 Hz, 400 Hz, for example, or other line frequency, is coupled to PLL input 20A. For purposes of this example, the line frequency $F_L$ supplied to PLL input 20A is 60 Hz, although this is not to be taken as being in any way limiting. For convenience, $F_L$ will refer not only to the frequency of the line frequency signal supplied to input 20 but will also be used to identify that line signal.

PLL input 20A is coupled to the (+) input 30A of a phase detector 30 which monitors the phase difference between the line signal supplied to PLL input 20A and a feedback signal supplied to the (−) input 30B of phase detector 30. A direct current (DC) voltage proportional to this phase difference is generated at the output of phase detector 30.

The output of phase detector 30 is coupled to the input of a voltage controlled oscillator (VCO) 40. The output of VCO 40 is coupled by a divider circuit 50 to input 30B of phase detector 30 to provide the aforementioned feedback signal thereto. In this particular embodiment of the invention, divider 50 is a divide by 1024 divider, although the invention is certainly not limited to this divisor. The divisor associated with divider 50 is sufficiently large that power monitor 10 achieves a data sampling rate high enough to sample input data accurately as will be described subsequently in more detail. The output of PLL 20 is taken at the output of VCO 40 as seen by the connection of PLL output 20B coupled to VCO 40 in FIG. 1. Assuming the line frequency signal provided to PLL input 20A is at a frequency, $F_L = 60$ Hz, then the PLL output frequency $F_P = 60 \times 1024 = 61440$ Hz or 61.44 KHz. For convenience, $F_P$ will be used not only to refer to the frequency of the PLL output signal but also to refer to the PLL output signal itself. From the above it is seen that PLL 20 behaves essentially as a frequency multiplier, the output signal $F_P$ of which provides a reference clock signal or time base from which the data sampling rate for power monitor 10 will be derived. PLL circuit 20 assures that the $F_P$ PLL output signal is locked in frequency and phase to the 60 Hz $F_L$ line signal. That is, the $F_P$ PLL output signal is synchronized with the $F_L$ line signal such that an integer number of pulses is generated in the $F_P$ PLL output signal for every cycle of the $F_L$ line signal.

PLL output 20B is coupled via a divider circuit 60 to the input of a divider/address generator circuit 70. In this embodiment, the divisor M of divider circuit 60 is 9. In this manner, the $F_P$ PLL output signal is divided or "slowed down" by a factor of $M=9$ prior to being supplied to the input of divider/address generator circuit 70. The power monitor is not limited to a divisor of 9 for divider circuit 60 as will become clear in the subsequent discussion. For sake of completeness, however, it is noted that when the divisor of divider circuit 60 is 9, the divided down $F_P$ PLL output signal exhibits a frequency, FD1, of 61440 Hz/9 or 6826.7 Hz and is hereafter referred to as the FD1 signal.

This particular embodiment of the power monitor is used to monitor up to 8 different parameters although again this should not be taken as being a limitation. For example, in a three phase power system (not fully shown), VA, VB and VC represent the voltages of the three phases and IA, IB and IC represent the corresponding currents associated with such voltages, respectively. An eight (8) input sample and hold circuit 80 is employed to sample these voltages and currents. More specifically, the 8 inputs of sample and hold circuit 80 are coupled via various voltage and current sensors (shown later) to the respective three phases. That is, conventional voltage sensors are coupled to and used to sense the VA, VB and VC voltages and supply indicia of such voltages to sample and hold inputs designated VA, VB and VC, respectively. Similarly, conventional current sensors are coupled to the three phases or lines on which the VA, VB and VC voltages are present to generate respective current sense signals IA, IB and IC which exhibit indicia of such respective currents. A current sensor is also coupled to the neutral line and the sensed neutral current is designated IN. The sensed current signals IA, IB, IC and IN are coupled to respective inputs on sample and circuit 80 indicated as inputs IA, IB, IC and IN. In this particular embodiment, the remaining eighth input of sample and hold circuit 80 is designated as S which is an unused spare input. (Eight (8) input sample and hold circuits are common whereas a 7 input sample and hold circuits are specialty devices.) Sample and hold circuit 80 includes a respective analog output for each input. That is, in this embodiment, sample and hold circuit 80 includes 8 analog outputs for holding the data sampled at the corresponding 8 inputs.

It is noted that the samples of VA, VB, VC, IA, IB and IC (plus IN and spare) are taken when an enable signal is received at the enable input (EN) of sample and hold circuit 80. In this manner a set of 8 voltage-current samples or voltage-current "sample set" is taken for each enable signal supplied to sample and hold circuit 80. It is further noted that within each voltage-current sample set, the VA, VB, VC, IA, IB and IC (plus IN and spare) samples are taken simultaneously to provide accuracy in the WATTS and VARS (volt-amps reactive) calculations later described.

The actual rate at which the sample sets are taken is determined by the rate at which the enable input of sample and hold circuit 80 is clocked. The enable input of sample and hold circuit 80 is clocked at a frequency FD2 which depends on both the divisor of divider circuit 60 and the divisor of divider/address generator circuit 70. In this embodiment of the invention, the divisor of divider/address generator circuit 70 is selected to be equal to the number of inputs of sample and hold circuit 80, namely 8. Thus, the enable rate FD2 is equal to FD1/8 or in this embodiment 6826.7 Hz/8 or 853.33 Hz. Address generator/divider 70 generates different 3 bit addresses at a rate 8 times that of the sample and hold rate of FD2. That is, in one embodiment, address generator/divider 70 is a divide by 8 counter which counts from 0 to 7 thereby causing an output pulse every 8 cycles. The internal states of such counter are externally available as a "3 bit" address which addresses multiplexer 90. For example, address generator/divider 70 includes address outputs A, B and C of which represent the lowest order, middle order and highest order address bits, respectively. FIG. 2 is an address map of the addresses which are generated by address generator/divider circuit 70. Each time circuit 70 receives an FD1 pulse from divider 60, a different one of eight possible 3 bit addresses is generated as seen in the FIG. 2 address map. Returning again to FIG. 1, power monitor 10 includes a multiplexer 90 which has 8 analog sample inputs [VA(s), VB(s), VC(s), IA(s), IB(s), IC(s), IN(s) and S(s)] and 1 analog output. Multiplexer 90 further includes address inputs 90A, 90B and 90C which are coupled to address outputs A, B and C, respectively, of address generator 70. Each of the 8 analog inputs of multiplexer 90 is coupled to a respective one of the 8 analog outputs of sample and hold circuit 80 as shown in FIG. 1. The output of multiplexer 90 is coupled to the input of an analog to digital (A/D) converter 100. A/D converter 100 includes an enable input which is coupled to the output of divider 60 and is thus supplied with the FD1 signal. Each set of 8 samples is thus sequentially multiplexed into the input of A/D converter 100. A/D converter 100 converts each sample to a digital equivalent which is supplied to a microprocessor 110 via bus 115 for storage in a random access memory (RAM) 120 as shown in FIG. 1. RAM 120 is coupled to microprocessor 120 via a bus 125. Microprocessor 120 manipulates and stores the sampled data under the direction of a control program stored in a read only memory (ROM) 130. ROM 130 is coupled to microprocessor 120 via a bus 135. Microprocessor 110 performs calculations to determine the real power (watts) and volt-amps reactive (VAR) of the sampled input line signal, $F_L$.

The sampling of the line input signal and the flow of the sampled data throughout power monitor 10 from the VA, VB, VC, IA, IB and IC (plus IN and spare S) inputs is now discussed in more detail. From the above it will be recalled that the enable input EN of sample and hold circuit 80 is clocked at a divided down rate of FD2 or 853.33 KHz. Thus a set of 8 samples VA, VB, VC, IA, IB and IC (plus IN and spare S) is taken for each enable clock pulse which the sample and hold circuit 80 receives. Once sampled, these 8 samples are held at the respective 8 outputs of sample and hold circuit 80 until the next enable clock pulse arrives. Since divider/address generator 70 is a divide by 8 divider, the input signal FD1 to divider/address generator 70 is 8 times faster than the output signal FD2 (enable clock) which is at 6826.7 Hz. Thus, divider/address generator 70 will sequentially generate the eight different addresses shown in FIG. 2 for each output pulse FD2 which it generates. Stated alternatively, divider 70 cycles through the 8 addresses for each output pulse FD2 which it generates.

To fully understand the dynamics of the sampling, multiplexing and A/D conversion mechanisms of power monitor 10, it is convenient to discuss the behavior of monitor 10 with respect to each FD1 pulse which is supplied both to the input of divider/address generator 70 and the A/D converter 100 enable line. A representative series of 10 FD1 pulses designated FD1(1), FD1(2), . . . FD1(10) is discussed. When pulse FD1(1) is supplied to divider 70, divider 70 generates the first address 000 seen in the table of FIG. 2. This causes multiplexer 90 to select the sample at the VA(s) input thereof and provide the VA(s) sample to the output of multiplexer 90. Next, when pulse FD1(2) is supplied to divider 70, divider 70 generates the second address 001 seen in the table of FIG. 2. This causes multiplexer 90 to select the sample at the VB(s) input thereof and provide the VB(s) sample to the output of multiplexer 90. Similarly, when pulse FD1(3) is supplied to divider 70, divider 70 generates the third address 010 in the table of FIG. 2.

This process continues with pulses FD1(4), FD1(5), FD1(6), FD1(7) and FD1(8) resulting in divider/address generator 70 generating addresses 011, 100, 101, 110 and 111, respectively. Corresponding samples VC(s), IA(s), IB(s), IC(s), IN(s) and S(s) are provided to the output of multiplexer 90. As each of the VA(s), VB(s), VC(s), IA(s), IB(s), IC(s), IN(s) and S(s) samples reach the input of A/D converter 100 a corresponding enable pulse at the FD1 rate is received by A/D converter 100 thus instructing A/D converter 100 to convert each of such samples to a digital representation thereof. These digital representations of the original analog samples are referred to as the VA(s)', VB(s)', VC(s)', IA(s)', IB(s)', IC(s)', IN(s)' and S(s)' digital samples. These digital samples are provided to microprocessor 110 for manipulation and storage as discussed later.

Finally, after the eighth pulse, FD1(8), is supplied to divider 70, divider 70 generates a carry output which is the FD2 or enable signal for sample and hold circuit 80. The first digital sample set [VA(s)', VB(s)', VC(s)', IA(s)', IB(s)', IC(s)', IN(s)' and S(s)] has now been provided to microprocessor 110 for storage and manipulation, and it is time to proceed on to the second or subsequent sample set. The eighth FD1 pulse (FD1(8)) and the aforementioned resultant carry output signal (enable signal) cause a second sample set VA, VB, VC, IA, IB, IC, IN and S to be taken by sample and hold circuit 80. The next or ninth FD1 pulse, FD1(9), causes the address state of divider/address generator 70 to return to the 000 or first address. Pulse FD1(10) causes an advance to the next address and so forth. In this manner, the process of multiplexing the eight analog samples by multiplexer 90 is commenced on a second sample set until all eight samples of the second sample set are converted to corresponding digital representations by converter 100 and are provided to microprocessor 110 for storage and manipulation.

Figures 3, 4:
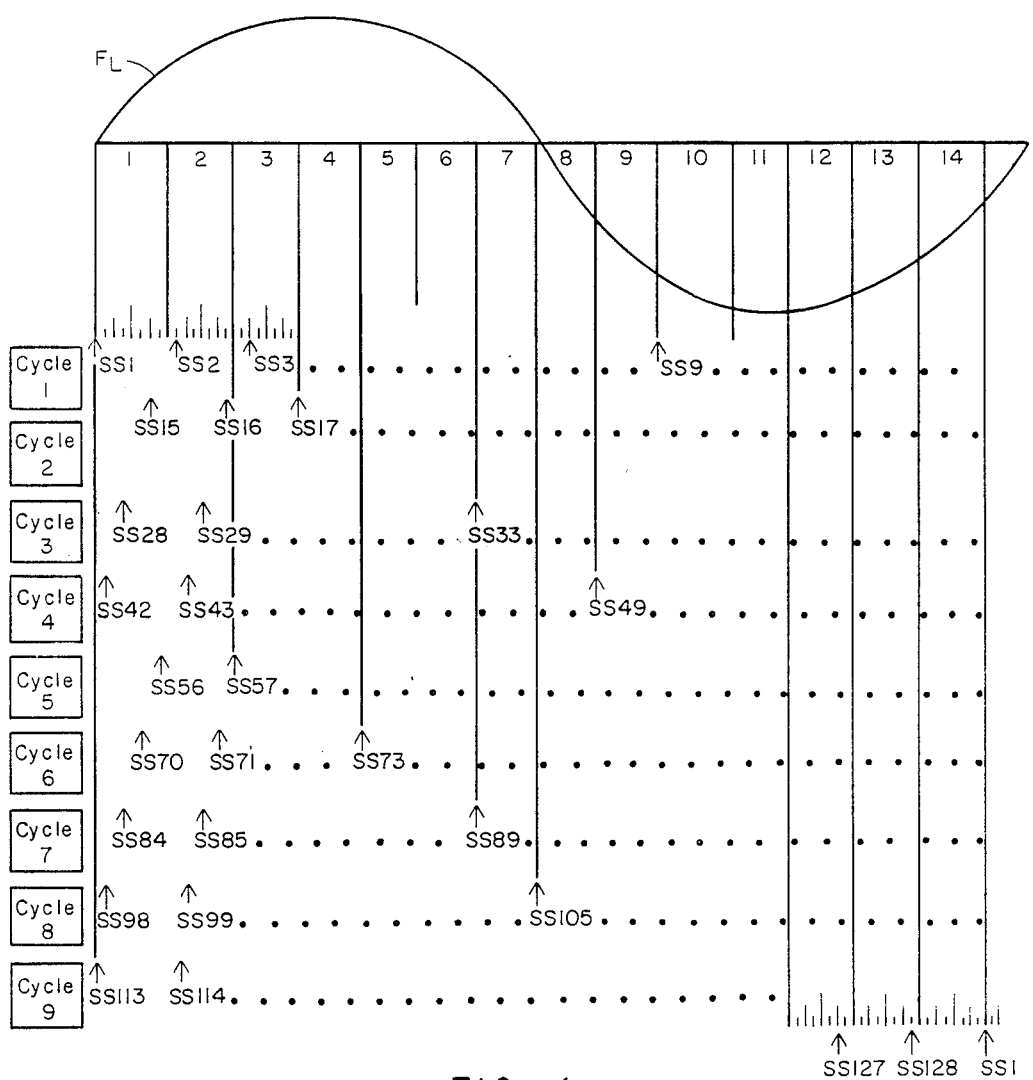
FIG. 3 is a table which represents the line input cycle number vs. the cumulative number of samples per cycle taken during an observation window in the power monitor.
FIG. 4 is representation of a plurality of superimposed line input signal cycles which depicts the relative positions of the respective samples sets in time with respect to the line input cycles in the power monitor.

This process of obtaining sample sets of the line input data continues at the rate of 853.33 Hz/line input frequency (60 Hz) or 14.22 times per input line cycle in this particular embodiment of the invention. Stated alternatively, 14.22 sample sets are generated per input line cycle in this embodiment. It will become clear later that the power monitor is not limited to exactly this number of sample sets per input line cycle. It is seen that since the number of sample sets taken per input cycle is not an integer number, that on a line cycle per line cycle basis, the relative time position at which the sample sets are taken will vary in time from cycle to cycle. This produces a "walk through" effect in which the time at which the sample sets are taken varies from line cycle to line cycle. As seen in the table of FIG. 3 which represents the line input cycle number vs. the cumulative number of cycles taken from the cycle 1 to the present cycle, the relative time position at which a sample set is taken within the observation window will not repeat until 128 sample sets have been taken or 9 line input cycles have elapsed. Thus, in the present embodiment of the power monitor, 128 sample sets of 8 parameters each will be taken over every 9 line input cycles. The "observation window" over which the line input waveform is sampled is thus defined to be 9 $F_L$ line cycles in this embodiment. It is noted that the observation window is equal to M line cycles, which an this embodiment equals 9 cycles and which corresponds to the divisor of divider circuit 60.

To more clearly illustrate this "walk through" effect, FIG. 4 is included to show a representation of 9 superimposed line input signal cycles which depicts, in part, the relative positions of the respective samples sets in time with respect to the line input cycles. For convenience, only a single line input wave and only the first three sample set positions during the first (cycle 1) line input cycle and the last three samples set positions in the last (cycle 9) input cycle are shown. In FIG. 4, SS1 represents the first sample set in the cycle 1, SS2 represents the second sample set in cycle 1, ..., SS15 represents the 15th sample set (cycle 2), SS16 represents the 16 sample set (cycle 2) and so forth up to SS128 which represents the 128th sample set which is timed to occur at the end of cycle 9. (It will be recalled that each voltage-current sample set includes the VA(s), VB(s), VC(s), IA(s), IB(s), IC(s), IN(s) and S(s) samples.

It will be demonstrated that when the sampling process continues in this fashion throughout the duration of the observation window, an "ensemble" of data points is collected for each analog input. After a prescribed number of samples for each input has been collected in memory 120, namely 128 in this embodiment, the ensemble will be processed by microprocessor 110 as described subsequently. Thus an observation window consists of 128 sample sets collected over M=9 line input cycles in this embodiment.

To permit a fuller appreciation of the timing considerations involved in the power monitor with respect to the $F_P$ PLL output frequency and the selection of the observation window through the choice of the divisor for divider circuit 60, PLL 20 and divider circuit 60 are now discussed in more detail.

Referring again to FIG. 1, it will be recalled that phase locked loop (PLL) 20 acts as a frequency multiplier. The input signal supplied to PLL 20 is a signal representative of the power line input frequency. The PLL "locks" precisely to the input signal frequency and assures that the above described sampling process occurs exactly at a known rate with respect to the line frequency whether that be 50 or 60 Hertz or other line frequency. When the loop is "locked", the signals at inputs 30A and 30B of phase detector 30 must be exactly at the same frequency but may have a phase offset, depending upon the particular design of the PLL. This forces the output frequency $F_P$ of PLL 20 to be N times the line frequency where N represents an integer divider. The line input signal thus includes N time intervals per input cycle. If N is a large number, then VCO 40 will run at a higher frequency [N * F(line)] and the resolution of the loop will be very small. Under all circumstances, the loop can only lock to within one interval of time. Thus a relatively low value of N will not permit the loop to stay locked long enough to collect the ensemble of data points for each input. Conversely, if N is large it may take the loop a prohibitively long time to acquire lock. The purpose of the PLL is to assure that the input signal is sampled synchronously over an exactly known number of integer line cycles (50 or 60 Hz, for example). Thus the output $F_P$ from the PLL is a digital signal at exactly N times the input line frequency. For the multiplexer circuit 90 discussed earlier, N must be at least 144 if the Nyquist sampling criterion is just met (sampling rate=2 * line frequency). More specifically, it is noted that N is determined by the relationship $2F_L \times 8 \times 9 = F_L \times N$. It is also noted that the actual line frequency $F_L$ is unimportant so long as the loop can acquire lock.

As mentioned above, FIG. 1 shows a divider 60 between PLL 20 and the divider 70/multiplexer circuit 90. It is this divider 60 which permits the observation window to be adjusted over a known number of integer input line cycles. From the above discussion, two conditions are known at this point by the design of the multiplexer 90 and PLL 20. These are:

(1) The PLL output frequency $F_P$ is N times the line frequency, and
(2) The multiplexer input frequency FD1 is 8 times the sampling rate FD2.

The inclusion of divider 60 closes the entire interrelationship among these variables as:

$$FD2 = (N/8)/M \cdot F_L$$

where K is the integer divisor associated with divider 60 following the PLL. If N=1024 and K=9 then, $$\frac{FD2}{F_L} = \frac{1024}{9 \times 8}$$

or, $$\frac{FD2}{F_L} = \frac{128}{9}$$

The above equation should be viewed as an integer proportion since N and K are constrained to integer values. That is, there are 128 integer sample sets during 9 line input cycles. Since the observation window must be an integer number of cycles, the minimum observation window must be nine input line cycles for this particular example. And, if the observation window is lengthened in this example, it is lengthened in multiples of 9 input cycles. The inter-relationship between the selection of the K divider and the observation window is thus illustrated. For instance, in an alternative embodiment, if K=8, then there is an integer number of samples every input cycle and the observation window may be any number of integer input cycles. In another alternative embodiment, if N=2048 and K=5, then 256 integer samples may be collected over a observation time of 5 input cycles, or a multiple thereof.

II. A Second Embodiment of the Invention

An embodiment of the invention wherein K=8 such that 120 sample sets are taken over 8 input line cycles is now discussed. In this embodiment, as well as the already discussed embodiment, RAM 120 includes three memory areas, namely, RAM(1), RAM(2) and RAM(3). Under the supervision of the control program stored in ROM 130, data is stored in one of the three memory areas until all 120 points of a particular ensemble (first ensemble) have been accumulated therein. Then data is stored in a second one of the three memory areas with continual updating while microprocessor 110 operates on and analyzes the first ensemble of data. When the analysis of the first ensemble is complete, microprocessor 110 switches back to the first memory area for data storage while it analyzes the data in the second memory area. The control program continually monitors the incoming data to see if any sample has an amplitude which exceeds a predetermined threshold level indicative of a transient. Should a transient be detected in this manner, the stored data of the present ensemble up to that point is saved for later display or transient analysis and a third one of the three memory areas is then used for storing data from the next ensemble. After the transient data is analyzed, the memory area containing the transient data is again free for data storage. In summary, two of the three memory areas are used for working data storage and analysis while the third memory area is available for transient storage.

Figures 5, 6, 8:
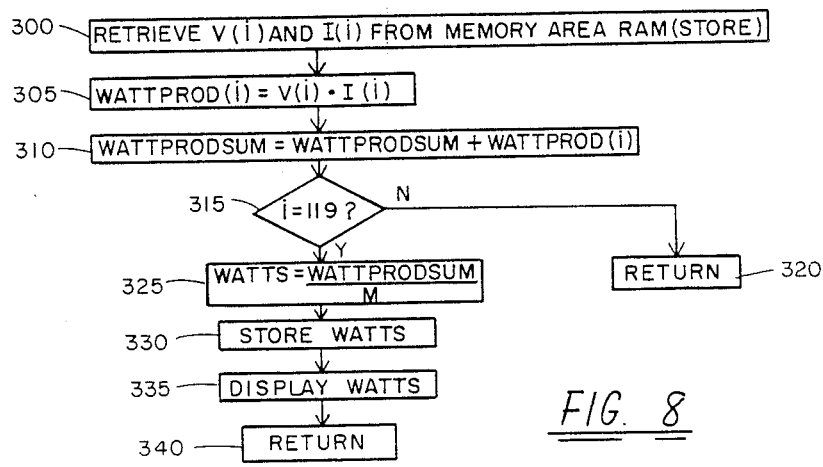
FIG. 5 is a memory map which shows how the sampled data is stored in random access memory (RAM)
FIG. 6 is a table which depicts the V(i) I(i) pairs of an ensemble next to their respective indices.
FIG. 8 is a flow chart of the WATTS subroutine employed in the power monitor of the present invention.

FIG. 5 is a memory map which shows how the sampled data is stored in memory 120 in the appropriate RAM. Since in this embodiment of the invention 120 samples are taken over 8 line input cycles, each sample V(i) or I(i) will be 3 degrees apart. In this map, "i" is defined to be an index which varies from 000 to 119. In this manner all 120 V(i) and I(i) in a particular ensemble are provided with a unique label. The first or leftmost column in FIG. 5 represents the angular displacement from one sample to the next sample. This angular information is not separately stored in memory 120, but is included in FIG. 5 to more clearly specify the relative location of the corresponding V(i) and I(i) samples with respect to the line input signal. The second column contains the aforementioned index "i" as it varies from 0 to 119 adjacent the corresponding V(i) and I(i) samples. Columns 3 and 4 contain the V(i) and I(i) samples for each ensemble of 120 samples. It is noted that the I(i) samples actually contain angular information such the I(i) samples are actually I(i) cos ($\theta$) where cos ($\theta$) is commonly called the "power factor". The power factor is a measure of how efficiently power is being delivered to a load. Since the current sensor (not shown) is measuring instantaneous current at the time of sampling, the sensed current value includes the power factor. The input sensors measure actual current and voltage at a given instant in time. Therefor, the product of these two quantities is real power flowing past the sensor. As additional background, it is noted that the power factor is a mathematical contrivance which accounts for voltage and current waveforms being out of phase by a certain phase angle. It is noted that under ideal conditions, voltage and current waveforms are in phase. That is, under ideal conditions, all power would be real (WATTS) and no imaginary power/reactive power (VARS-volt-amps reactive) would be present. However, in actual practice, reactive loads are often encountered in power distribution systems and thus imaginary power is present. The power monitor of the present invention is useful in monitoring both real power (WATTS) and imaginary power (VARS). Microprocessor 110 calculates the power or WATTS associated with a particular ensemble of V(i) and I(i) cos ($\theta$) data according the following relationship:

$$\text{WATTS} = \frac{1}{M} \sum_{i=0}^{119} V(i)I(i)\cos(\theta)$$

Thus, microprocessor 110 sums all 120 (i=000−119) products over M input samples (M=120 here) to obtain a quantity WATTSPRODSUM. WATTSPRODSUM is then divided by M to obtain the quantity WATTS which is the real power associated with the selected observation window.

Microprocessor 110 also calculates the imaginary power or VARS (volts-amps reactive) associated with a particular ensemble of V(i) and I(i) data according the following relationship:

$$\text{VARS} = \frac{1}{M} \sum_{i=1}^{119} V(i)I(i)\sin(\theta)$$

It will be recalled that the memory map of the RAM as shown in FIG. 5 contains I(i) cos ($\theta$) information rather than the I(i) sin ($\theta$) information called for in the above VARS relationship. Unfortunately as noted earlier, the current sensor current sensor can only measure a composite value I(i) cos ($\theta$) while the reactive power calculation requires I(i) sin ($\theta$). However, the sin and cos functions are related by the trigonometric relationship:

$$\sin(\theta) = \cos(\theta + 90)$$

Thus, when calculating VARS, to generate a value of I(i) sin ($\theta$) corresponding to a particular V(i) value, an offset of 90 degrees is used. That is, the I(i) value corresponding to a particular V(i) value is obtained by using the above trigonometric relationship. More specifically, the following relationship is used to calculate VARS in this situation using the offset of 90 degrees referred to above:

$$\text{VARS} = \frac{1}{M} \sum_{i=1}^{119} V(i)I(i)\cos(\theta + 90)$$

One way to visualize this offset technique is shown in the table of FIG. 6 which depicts the V(i) I(i) pairs of an ensemble next to their respective indices. For example, the first V(i) I(i) pair is formed by the product of the value of V(i) obtained from index 000 (angle of 0 degrees) in RAM 120 and the I(i) value obtained from index 030 (angle of 90 degrees) in the RAM 120. In a similar manner, the second V(i) I(i) pair is formed by the product of the value of V(i) obtained from index 001 (angle of 3 degrees) in the RAM and the I(i) value obtained from index 031 (angle of 93) in the RAM. This multiplication process continues in this manner until finally the last sample in the ensemble is processed. That is, the last V(i) I(i) pair is formed by the product of the value of V(i) obtained from index 119 (angle of 357 degrees) in the RAM and the I(i) value obtained from index 029 (angle of 87 degrees) in the RAM. To finally obtain the VARS for this ensemble, all the V(i) I(i) products associated with the ensemble are summed and then divided by the number cycles in the observation window, namely 8 in this embodiment (M=8).

III. Flowchart

To enable better understanding of the invention, a flowchart of the control program in ROM 130 is now discussed. Although the control program now discussed relates to the second embodiment above wherein 120 samples are taken in an observation window including M=8 lines cycles, it is readily adapted to observation windows including different numbers of line cycles and a different numbers of samples. The control program illustrated in FIG. 7 controls the data gathering, memory storage and data analysis activities of microprocessor 110. The variables STORE and ANAL are initialized at 1 and 2 respectively at block 200. STORE and ANAL represent which ones of the three memory storage areas RAM(1), RAM(2) and RAM(3) are currently available for storage of data and analysis of that data as will become clear in the subsequent discussion of the flowchart. The EAFLAG or enable analysis flag is initialized at zero to prevent data analysis until one of memory storage areas RAM(1) and RAM(2) is filled with data. Lockout flags LOFLAG(1), LOFLAG(2) and LOFLAG(3) are initialized to 0 (zero) to signify that all three memory storage areas RAM(1), RAM(2) and RAM(3) are available for data storage. Index i is initialized at 0 (zero) and has a range of 0-119 representing the number of samples in the observation window selected in this embodiment. WATTSPRODSUM and VARSPRODSUM are initialized with values of 0 (zero) at block 200. WATTSPRODSUM and VARSPRODSUM are used in the WATTS and VARS calculation subroutines discussed later. The variables k and p represent memory locations within RAM(1) or RAM(2) and are both initialized at 000. The variable q used in the VARS subroutine is also initialized at 0.

A sample set of data, namely VA(i), VB(i), VC(i), IA(1), IB(2), I(3), IN(i) and S(i), is taken at block 205. Each sample of this sample set corresponds to the respective input of sample and hold circuit 80 which exhibits a similar designation. Each member of the sample set of data is converted from an analog sample to a digitized sample representation thereof at block 210. A decision is then made at block 215 to determine which of the three memory areas RAM(1), RAM(2) and RAM(3) are presently available for data storage and data analysis. That is, a determination is made to find if any memory storage area RAM(1), RAM(2) and RAM(3) is locked out by its respective lockout flag being set to 1. More specifically, at block 215, if LOFLAG(1) is not equal to 1 and LOFLAG(2) is not equal to 1, then STORE and ANAL are permitted to assume values of either 1 or 2 corresponding to RAM(1) or RAM(2). In this instance, RAM(1) and RAM(2) are available for storage and data analysis. If LOFLAG(1) is equal to one, then STORE and ANAL are permitted to assume values of either 2 or 3 such that RAM(2) and RAM(3) are available for storage and data analysis. However, if LOFLAG(2) is equal to one, then STORE and ANAL are permitted to assume values of either 1 or 3 such that RAM(1) and RAM(3) are available for storage and data analysis.

The digitized representation of the sample set VA(i), VB(i), VC(i), IA(1), IB(2), I(3), IN(i) and S(i) are then stored in one of three areas in memory RAM(1) RAM(2) or RAM(3) as per block 220. Immediately after this program is initialized, since STORE=1, the first RAM area to be used for storage is RAM(1). At the time of sampling, a transient current test is conducted at decision block 225 to determine if any of the three current samples IA(i), IB(i) and IC(i) exhibit an amplitude greater than a predetermined threshold current (THRESH). THRESH is a value selected to be sufficiently high such that if any of the three samples I(i), IB(i) and IC(i) exceed THRESH, such sample which exceeded THRESH is deemed to be a transient current. If a transient is not detected then flow continues to block 230 at which the EAFLAG is tested to determine if it has been set. If the EAFLAG is found to have a value of 0, as it will on the first run immediately after initialization, then WATTS, VARS and TRANSIENT analysis are not permitted. In this situation, the WATTS, VARS and TRANSIENT subroutine entry points at blocks 235, 240 and 245, respectively, are bypassed and flow continues to decision block 250. At decision block 250 a determination is made to find if the index i has reached 119 yet. That is, have all the samples sets in the present incoming ensemble or current observation window been stored. If not, then index i is incremented by 1 at block 255 and flow is routed back to block 205 at which the next sample set VA(i), VB(i), VC(i), IA(1), IB(2), I(3), IN(i) and S(i) is taken.

After all samples within the selected observation window are taken (120 samples in this embodiment), then the test at block 250 will find that i=119 and flow will continue to block 260. At block 260, the values of STORE and ANAL are swapped such that the memory storage area or RAM which was just being used for data storage will now be analyzed and the memory storage area which was being analyzed, if any, will now be used for data storage. Thus, after the first ensemble of 120 samples sets are stored in RAM(STORE)=- RAM(1), that is when STORE=1, and ANAL=2 (but no data has thus far been stored in RAM(2)), then the values of STORE and ANAL are swapped such that for the next ensemble of samples sets, the samples are stored in RAM(2) while the samples already collected in RAM(1) are now analyzed. Flow then continues to block 265 at which the enable analysis flag EAFLAG is set to 1 such that WATTS and VARS analysis is now enabled when flow continues back to block 205 which starts the gathering of the next ensemble of samples. Thus, when flow continues through blocks 210, 215, 220 and 225 to decision block 230, for the second or later ensemble the EAFLAG will be found to be set to 1. When this occurs, the WATTS, VARS and TRANSIENT subroutine entry points at blocks 235, 240 and 245 will not be bypassed. Rather, during the second or other subsequent ensemble when the EAFLAG=1, the WATTS subroutine will be entered at the GOSUB (go to subroutine) instruction at block 235. That is, the WATTS analysis subroutine will be entered and applied to RAM(ANAL) which is normally RAM(1) or RAM(2) for non-transient conditions. Assuming, for purposes of example that RAM(ANAL) is now RAM(1), the WATTS analysis subroutine will operate on memory storage area RAM(1).

As seen in block 300 of the WATTS analysis subroutine of FIG. 8, V(i) and I(i) are retrieved from RAM(1) for the current value of index i. For convenience, in the WATTS subroutine of FIG. 8, only a single V(i) I(i) pair is shown as being retrieved from RAM(ANAL) and processed whereas in actual practice substantially similar WATTS analyses are conducted for all three V(i) I(i) pairs, namely, VA(i) IA(i), VB(i) IB(i) and VC(i) IC(i). WATTPROD(i) is determined at block 305 and is found to be equal to V(i) multiplied by I(i) for the current value of index i. WATTPRODSUM is calculated at block 310 to be equal to WATTPRODSUM (initialized at 0) plus the WATTPROD(i) just previously determined in block 305.

Flow then continues to block 315 at which a determination is made to find if i=119, that is, to determine if all sample V(i) I(i) pairs in RAM(ANAL) have been analyzed. If all such sample pairs have not been analyzed, then flow continues to block 320 which returns control to the main program of FIG. 7 at the entry point at block 235. However, assuming for the moment that for purposes of example, when block 315 in the WATTS subroutine is reached, all samples pairs have been processed such that i=119. In this case, flow continues to block 325 at which the calculation WATTS=WATTPRODSUM/M is made, wherein M equals the total number of samples in the observation window. The quantity WATTS is then stored in block 330 and displayed to the user at block 335. Once the WATTS analysis subroutine is completed at block 340, control is returned to the entry point at block 235 in the main program of FIG. 7.

Figure 9:
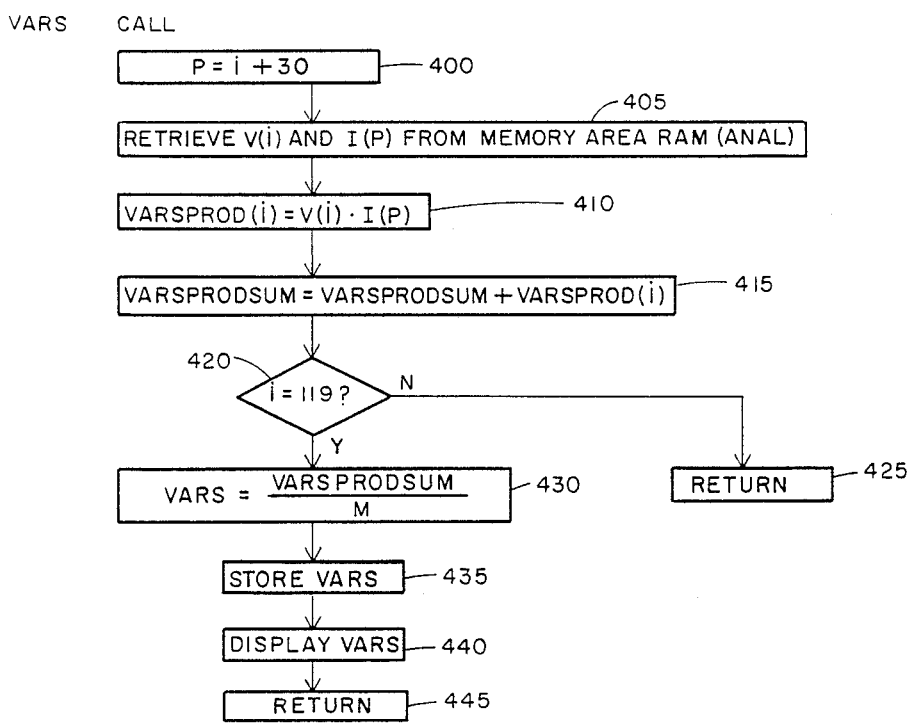
FIG. 9 is a flow chart of the VARS subroutine employed in the power monitor of the present invention.

Each time control is returned from the WATTS analysis subroutine to block 235, flow continues to block 240. When this occurs, the VARS analysis subroutine is entered and the quantity p is defined to equal i+30 at block 400 in the VARS subroutine shown in FIG. 9. This technique is used to obtain the offset of 90 degrees discussed earlier with respect to the I sin ($\theta$) term in the VARS calculation discussed earlier. The voltage sample V(i) and the corresponding offset current value I(p) are retrieved from memory area RAM(ANAL) as per block 405. For convenience, in the VARS subroutine of FIG. 9, only a single V(i) I(p) pair is shown as being retrieved from RAM(ANAL) and processed whereas in actual practice substantially similar VARS analyses are conducted for all three V(i) I(p) pairs, namely, VA(i) IA(p), VB(i) IB(p) and VC(i) IC(p). VARSPROD(i) is determined at block 410 and is found to be equal to V(i) multiplied by I(p) for the current value of the index i. VARSPRODSUM is calculated at block 415 to be equal to VARSPRODSUM (initialized at 0) plus the VARSPROD(i) just previously determined in block 410.

A determination is then made at block 420 to find if i=119, that is, to determine if all sample V(i) I(p) pairs in RAM(ANAL) have been analyzed. If all such sample pairs have not been analyzed, then flow continues to block 425 which returns control to the main program of FIG. 7 at the entry point at block 240. However, assuming that for purposes of example, when block 420 in the VARS subroutine is reached, all samples pairs have been processed such that i=119, then in this case, flow continues to block 430 at which the calculation VARS=VARSPRODSUM/M is made, wherein M equals the total number of samples in the observation window. The quantity VARS is then stored at block 435 and displayed to the user at block 440. Once the VARS analysis subroutine is completed at block 445, control is returned to the entry point at block 240 in the main program of FIG. 7.

The aforementioned transient analysis is now discussed in more detail. If any one of the current samples IA(i), IB(i) or IC(i) are determined to exhibit an amplitude greater than the quantity THRESH at block 220, then flow is directed to block 500 at which LOFLAG(STORE) is set equal to 1. In this manner, the memory area RAM(STORE) in which the just detected transient current is stored is "locked out" so that such memory area is not available for storage of subsequent sample ensembles until the transient data in such memory area is displayed or subjected to analysis. At block 505 the label TRAN is set equal to STORE to preserve the label of the memory area RAM(STORE) in which the transient occurred, namely RAM(TRAN). In subsequent blocks 510, 515, 520, 525 and 530, the WATTS and VARS analyses for the current RAM(ANAL) ensemble are continued and completed. That is, block 510 provides entry to the WATTS subroutine. Block 515 provides entry to the VARS subroutine. At block 520, the transient data contained in RAM(TRAN) is displayed or, in another embodiment, the subroutine TRANSIENT is entered as now discussed.

The TRANSIENT subroutine of the current ensemble stored in RAM(TRAN) may take the form of any standard and well know transient analysis technique. Such transient analysis is indicated generally at block 600 of the TRANSIENT subroutine shown in FIG. 10. Alternatively, the transient data may simply be displayed for observation by the user of the power monitor of the invention. A test is then conducted at decision block 605 to determine if the transient analysis is completed. If the transient analysis is found to be incomplete, then flow continues to block 610 which returns control to the main program at the entry point provided by block 520.

Figure 7:
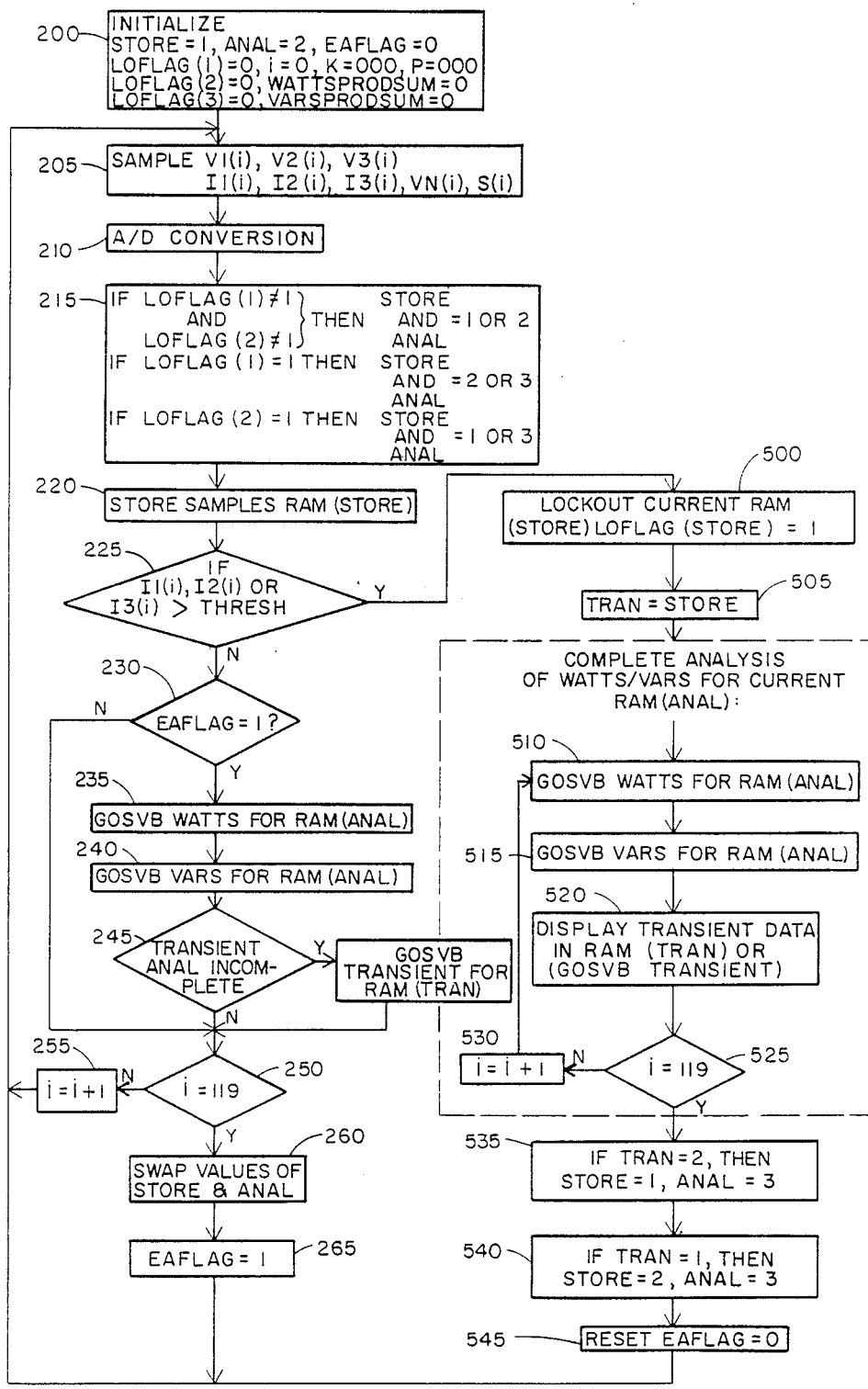
FIG. 7 is a flow chart of the main control program which resides in memory in the power monitor of the invention.

In the case where transient analysis is found not to be complete at decision block 605, flow returns via block 610 to decision block 525 of the main control program of FIG. 7. Block 525 makes its own determination as to whether or not all sample sets in RAM(ANAL) have been analyzed. If not, i is incremented by 1 at block 530 and flow continues back to block 510 at which the WATTS subroutine is reentered for the next sample set in the ensemble in RAM(ANAL). Finally when all the samples sets in the ensemble in RAM(ANAL) have been analyzed, flow continues to block 535 where, if TRAN has a value of 2, STORE is set to 1 and ANAL is set to 3. However, if TRANS has a value of 1, then STORE is set to 2 and ANAL is set to 3 at block 540. In this manner, the next memory storage areas to be used for data storage an data analysis are earmarked for such functions. In this manner the data in RAM(TRAN), the memory area where the transient information is contained, is preserved until transient analysis is complete. The enable analysis flag EAFLAG is reset to 0 at block 545 to prevent analysis until the data for the next ensemble is collected. Flow then continues to block 205 where sampling is resumed.

Figure 10:
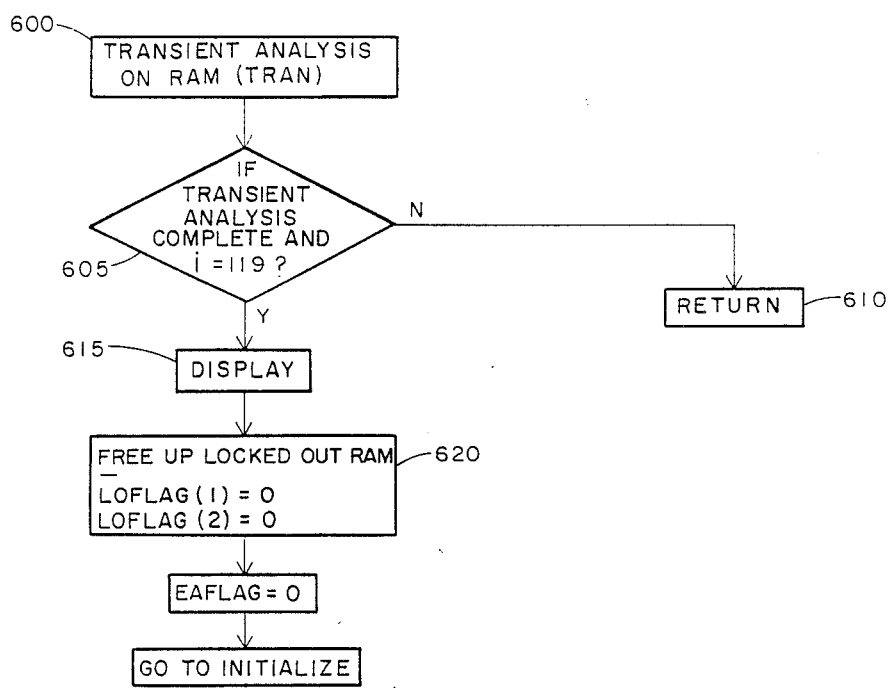
FIG. 10 is a flow chart of the TRANSIENT analysis subroutine employed in the power monitor of the present invention.

Transient analysis continues when block 245 is reached providing such analysis is found to be incomplete. That is, the TRANSIENT subroutine of FIG. 10 is re-entered and more transient analysis is conducted at block 600. If transient analysis is now found to be complete at block 605, then the results of the transient analysis are displayed at block 615. The lockout flags are then reset to zero at block 620 such that LOFLAG(1)=0 and LOFLAG(2)=0 thus freeing up either RAM(1) or RAM(2) for data storage once again. The enable analysis flag is reset to 0 at block 625 once transient analysis is complete to prevent analysis immediately after the system reinitializes as per block 630. That is, at block 630 of the TRANSIENT subroutine, flow is directed back to the initialize block 200 of the main control program of FIG. 7 to permit the system to restabilize and then continue collecting data sample ensembles and analyzing such ensembles.

In one embodiment of the power monitor of the invention, a determination is made as to what percentage of the current samples in RAM(TRAN) exceed the value THRESH. In such an embodiment, the control program is modified such that samples are taken throughout the duration of the observation window both before and after a first transient sample is detected to provide more information with respect to the transient conditions. Other known transient analysis techniques may be employed as well and the invention is not limited to any one particular transient analysis technique.

IV. The Preferred Embodiment of the Invention

Figure 11:
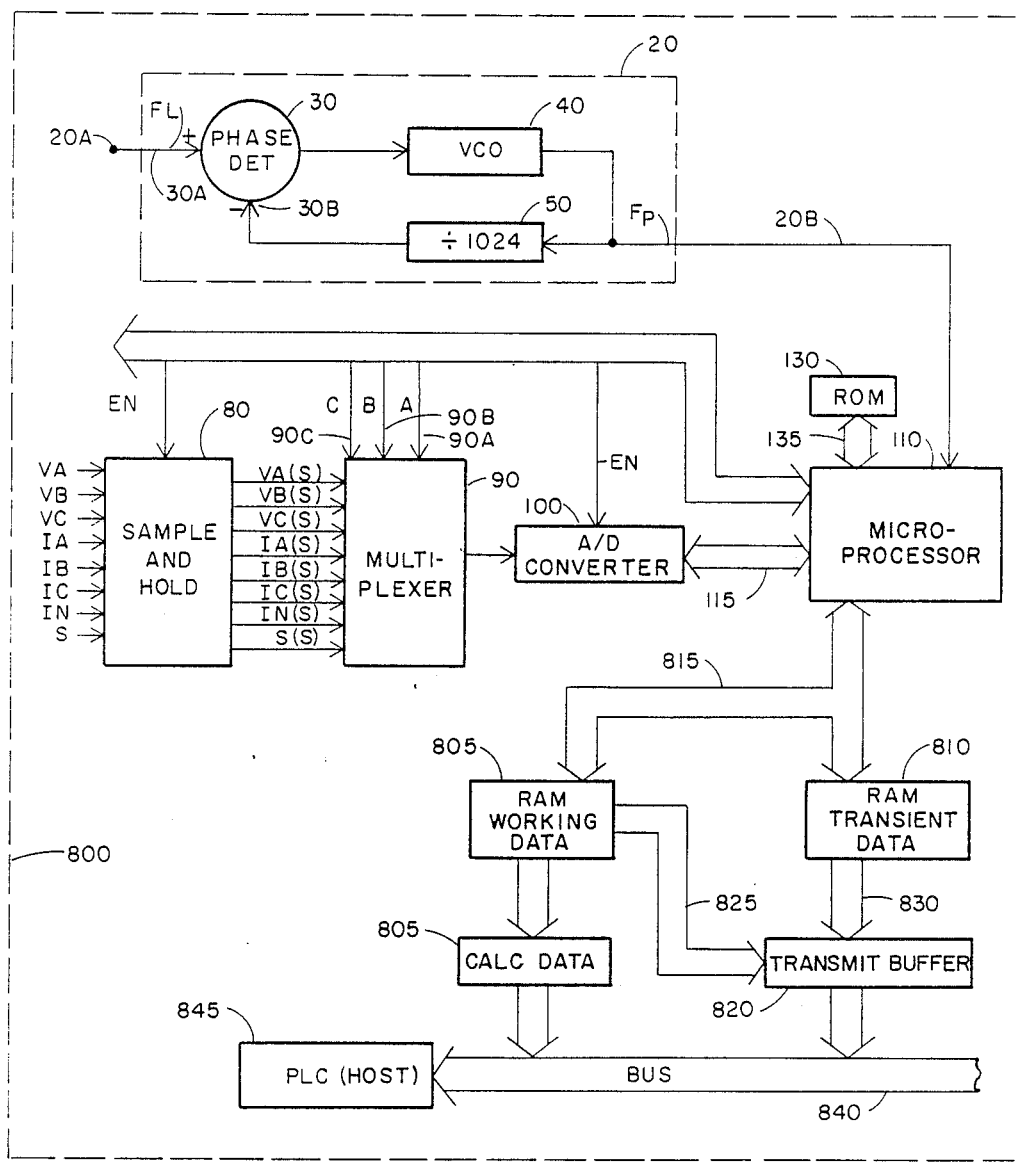
FIG. 11 is a block diagram of the preferred embodiment of the power monitor of the invention.

A preferred embodiment of the power monitor of the invention is shown in block diagram form in FIG. 11 as power monitor 800. Except for the following modifications, power monitor 800 is substantially similar to power monitor 10 of FIG. 1 with like elements being indicated by like numbers. In power monitor 800 an integral number of samples are taken per cycle of the line input signal $F_L$ during an observation window which is selected to be 8 cycles long for purposes of example. In this particular example, the divisors of divider circuits 50 and 60 are selected such that 16 sample sets are taken per cycle of the $F_L$ signal over every 8 cycles of the $F_L$ signal. That is, an ensemble of data includes 128 sample sets collected over the 8 cycles of the ensemble, 16 sample sets being collected during each cycle of the $F_L$ signal. In this embodiment, the sampling times of the 16 sample sets per cycle are timed to be distributed substantially uniformly throughout each cycle of the observation window. Those skilled in the art will appreciate that other observation windows of greater or lesser duration than 8 cycles may be employed as well in accordance with the invention.

As in power monitor 10, the output of A/D converter 100 is coupled to microprocessor 110 such that digital representations of the data from each cycle are supplied to microprocessor 110 which coordinates the storage of such data in memory. In this embodiment of the invention, microprocessor 110 is coupled to a "working data" RAM 805 and a "transient data" RAM 810 via a connecting bus 815.

In actual practice, RAM 805 and RAM 810 may be part of the same memory chip by using different starting addresses in that memory for the "working data" and the "transient data". RAM 805 and RAM 810 will also be referred to as the working data buffer and the transient data buffer, respectively. Working data buffer 805 and transient data buffer 810 are of the first in - first out type and each have sufficient capacity to hold an entire ensemble of data therein, that is, 128 sample sets over 8 cycles. For example, 1792 bytes was found to be a sufficient size for working data buffer 805 and transient data buffer 810 although this should not be taken as being in any way limiting.

The nature of the working data and transient data will be discussed in more detail subsequently. However, for now it is noted that the working data buffer 805 and transient data buffer 810 are coupled to the input of a the transmit buffer 820 via data busses 825 and 830. Transmit buffer 820 exhibits the same size as buffers 805 and 810. Transmit buffer 820 is coupled via a connecting bus 835 to a host bus 840 to which a programmable logic controller (PLC) 845 or other host is coupled. Host 845 requests working data, transient data and calculated data from power monitor 800 as will be seen subsequently. For example a programmable logic controller may be employed as PLC or host 845. The communication bus within such controller may be conveniently employed as host bus 840.

Although 128 sample sets are collected in a sequential manner over the 8 cycles of a particular ensemble, the 128 samples sets are stored in working data buffer 805 in an interleaved manner. More specifically, the 128 samples sets of an 8 cycle ensemble are taken sequentially in the order shown in the leftmost column of FIG. 12 starting with sample set 1 of cycle 1 (SS1). It will be recalled that each sample actually includes 8 samples taken simultaneously, namely VA, VB, VC, IA, IB and IC (plus IN and spare S). Sampling of the first cycle continues with the taking of sample sets SS2-SS16. Then, sampling of the second cycle commences with sample set SS17 and continues through sample set SS32. In a like manner, sampling of the third cycle commences with the taking of sample set SS33 and continues through SS48. Sampling continues in the same fashion with remaining cycles 4–8 until all 128 cycles of the ensemble are collected.

As mentioned above, although sample sets SS1–SS128 are collected sequentially, these samples are not stored in memory in the order collected but rather are stored in the interleaved fashion shown in the center column of FIG. 12. In this manner eight cycles of data are formed into the equivalent of a single cycle of data prior to watts, vars and power factor processing by microprocessor 100. In more detail, the leftmost column of FIG. 12 represents the sampling order of the sample sets SS1–SS128 and the rightmost column represents the interleaved storage order in working data memory 805 of sample sets SS1–SS128. To achieve such interleaving, as the data is taken, sample set SS1 is stored in memory location 1, SS2 is stored in location 9, SS3 is stored in location 17 and so forth for the remainder of the data of the first cycle as shown in FIG. 12. When the first sample set of the second cycle, namely SS17, is taken, SS17 is interleaved back into the already stored data by storing SS17 in memory location 2 which is immediately subsequent to memory location 1 used for the first cycle. Sample set SS18 is stored in memory location 10 which is immediately subsequent to memory location 9 used for the first cycle. In summary, the storage locations of the 16 sample sets of the second cycle are advanced one forward with respect to the storage locations of the sample sets of the first cycle. Continuing in the same fashion, the storage locations of the 16 sample sets of the third cycle are advanced one forward with respect to the storage locations of the sample sets of the second cycle and so forth until all 8 cycles of data SS1–SS128 are interleaved to form the equivalent of a single condensed cycle of voltage and current data. Thus the working data buffer 805 is filled with an interleaved ensemble of SS1–SS128 data in the above described manner to simulate a single cycle of the observed line signal.

After the ensemble of working data is collected in working data buffer 805, microprocessor 110 processes the working data to determine the real power (watts), imaginary power (vars) and power associated with the data in the ensemble. In this particular embodiment of the invention, the watts, vars and power factor are stored in the calculated data (cal data) buffer 850 which is coupled to working data buffer 805 as shown in FIG. 11. The calc data buffer 850 is coupled to bus 840 such that the calculated data can be provided to bus 840 and PLC 845 approximately once per second. The calculated data is automatically sent to PLC 845 approximately once per second without PLC or host 845 requesting such calculated data.

Figure 13:
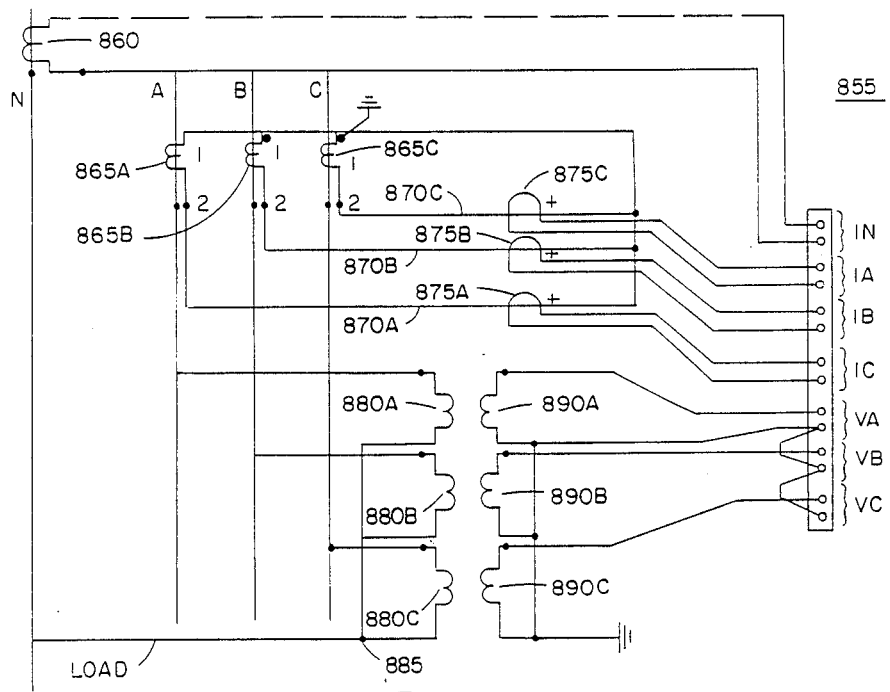
FIG. 13 is a schematic diagram of one sensing circuit which may be employed in the power monitor of the present invention.

An example of one voltage and current sensing circuit which may be employed in conjunction with the power monitor of the present invention is shown in FIG. 13 as sensing circuit 855. Sensing circuit 855 is of the line to neutral type although a line to line type sensing circuit could be employed as well. FIG. 13 shows three phases of power as phases A, B and C and a neutral line designated N. In sensing circuit 855, the line to neutral voltages are sensed and designated VA, VB, VC as shown. The currents in the respective phases A, B and C are sensed and are designated IA, IB and IC, respectively, as shown. The current in the neutral line is designated IN.

More specifically A transformer 860 is coupled to line N to sense the current IN therein as shown in FIG. 13. Current transformer (CT) windings 865A, 865B and 865C are inductively coupled to phases A, B and C as shown. Each of windings 865A, 865B and 865C includes opposed ends designated 1 and 2 combined with the winding number. Ends $865A_1$, $865B_1$ and $865C_1$ are coupled together and to ground as shown in FIG. 13. Additionally, ends $865A_1$, $865B_1$ and $865C_1$ are coupled via conductors 870A, 870B and 870C to ends $865A_2$, $865B_2$ and $865C_2$, respectively. Current transformer windings 875A, 875B and 875C are inductively coupled to conductors 870A, 870B and 870C such that the voltage induced in each of windings 875A, 875B and 875C is indicative of the currents IA, IB and IC flowing through phases A, B and C respectively.

Sensing circuit 855 includes potential transformer (PT) windings 880A, 880B and 880C. One end of each of potential transformer windings 880A, 880B and 880C are electrically coupled to phases A, B and C as shown in FIG. 13. The load associated with phases A, B and C is coupled between neutral N and node 885. The remaining ends of each windings 880A, 880B and 880C are coupled together at node 885. Potential transformer windings 890A, 890B and 890C are inductively coupled to windings 880A, 880B and 880C such that phase voltages VA, VB and VC appear across windings 890A, 890B and 890C as shown in FIG. 13. One end of each of windings 890A, 890B and 890C is coupled to ground. In this manner, sensing circuit 855 provides the power monitor with VA, VB, VC, IN, IA, IB and IC data for processing. This data is used to determine true RMS voltage and current along with real and imaginary power on a per phase basis. Total energy and system power factor are also provided.

Microprocessor 110 calculates the real power—WATTS, imaginary power—VARS, and power factor—PF associated with a particular ensemble as follows: For line to neutral connected potential transformers (PT's):

$$WATTS_A = \frac{1}{M} \sum_{j=1}^{128} VA(j)*IA(j)$$

$$WATTS_B = \frac{1}{M} \sum_{j=1}^{128} VB(j)*IB(j)$$

$$WATTS_C = \frac{1}{M} \sum_{j=1}^{128} VC(j)*IC(j)$$

$$TOTAL\ WATTS = WATTS_A + WATTS_B + WATTS_C$$

wherein $WATTS_A$, $WATTS_B$ and $WATTS_C$ represent the real power of phases A, B and C, respectively and wherein M equals the number of samples in the ensemble. VA(j), VB(j) and VC(j) represent the voltage samples from line to neutral of the respective phase being calculated and I(j) represent the current samples of the respective phase being calculated. It is noted that in this embodiment of the invention, for convenience phase angle terms in the WATTS and VARS equations are not shown since phase angle information is included in the IA, IB and IC variables. The value of j corresponding to the voltage and current samples stored in memory are shown in the rightmost column of FIG. 12.

$$VARS_A = \frac{1}{M} \sum_{j=1}^{128} VA(j)*IA(j + 90\ degrees)$$

$$VARS_B = \frac{1}{M} \sum_{j=1}^{128} VB(j)*IB(j + 90\ degrees)$$

$$VARS_C = \frac{1}{M} \sum_{j=1}^{128} VC(j)*IC(j + 90\ degrees)$$

$$TOTAL\ VARS = VARS_A + VARS_B + VARS_C$$

wherein $VARS_A$, $VARS_B$ and $VARS_C$ represent the imaginary power of phases A, B and C, respectively. VA(j), VB(j) and VC(j) still represent the voltage samples from line to neutral of the respective phases being calculated. The I(j+90 degrees) current values are obtained by retrieving the sample which is stored in memory in a location corresponding to 90 degrees after the particular I(j) sample. Since the length of the ensemble (128 samples sets) after storage in memory represents one cycle or 360 degrees, 90 degrees corresponds to 128/4 or 32 memory locations. Thus, to retrieve a current value I(j+90 degrees) wherein j=1, the desired current sample at I(1+32) or I(33) is actually retrieved.

For line to line connected potential transformers (PT's)

$$WATTS_A = \frac{1}{M} \sum_{j=1}^{128} IA(j + 90\ degrees)*(VA(j))/(3)^{\frac{1}{2}}$$

$$WATTS_B = \frac{1}{M} \sum_{j=1}^{128} IB(j + 90\ degrees)*(VB(j))/(3)^{\frac{1}{2}}$$

$$WATTS_C = \frac{1}{M} \sum_{j=1}^{128} IC(j + 90\ degrees)*(VC(j))/(3)^{\frac{1}{2}}$$

$$TOTAL\ WATTS = WATTS_A + WATTS_B + WATTS_C$$

wherein $WATTS_A$, $WATTS_B$ and $WATTS_C$ represent the real power of phases A, B and C, respectively.

VA(j), VB(j) and VC(j) in this case represent the voltage samples from lines B to C, C to A, and A to B, respectively, and I(j) represents the current samples of the respective phase being calculated.

$$VARS_A = \frac{1}{M} \sum_{j=1}^{128} IA(j)*(VA(j))/(3)^{\frac{1}{2}}$$

$$VARS_B = \frac{1}{M} \sum_{j=1}^{128} IB(j)*(VB(j))/(3)^{\frac{1}{2}}$$

$$VARS_C = \frac{1}{M} \sum_{j=1}^{128} IC(j)*(VC(j))/(3)^{\frac{1}{2}}$$

$$\text{TOTAL VARS} = VARS_A + VARS_B + VARS_C$$

$$\text{POWER FACTOR} = \frac{\text{TOTAL WATTS}}{(\text{TOTAL WATT}^2 + \text{TOTAL VAR}^2)^{\frac{1}{2}}}$$

In summary, microprocessor 110 calculates the parameters expressed above from the sample information in working data buffer 805 and sends the calculated data to the Calc Data buffer 850. The calculated data is then communicated to the PLC host 845 approximately one time per second.

Each current sample I(j) is tested by microprocessor 110 to determine if it is a transient. That is, each current sample I(j) is compared with a predetermined threshold level which if exceeded indicates that the particular I(j) sample is a transient. In this particular embodiment of the invention, to assure accuracy in trapping a transient, a transient is determined to be detected when microprocessor 110 finds that two successive I(j) samples exhibit an amplitude which exceeds the predetermined threshold level. Whether or not a transient is found, the same incoming data which is stored in working data buffer 805 in interleaved fashion is also stored in transient data buffer 810 in non-interleaved fashion. That is, the sample sets SS1-SS128 are stored sequentially in transient data buffer 810 in the same order as that in which they were taken by sample and hold circuit 80.

If it is determined that the current cycle contains a transient, then microprocessor 110 instructs transient data buffer 810 to retain the data from the last two pretransient cycles prior to the current cycle. The sample data from the current cycle containing the transient is also retained in transient data buffer 810. Microprocessor 110 also instructs transient data buffer 810 to store the sample data from the 5 post-transient cycles occurring after the cycle found to contain the transient. In this manner, after a transient is detected, transient data buffer 810 is filled with 8 cycles of sample data or 128 samples sets stored in non-interleaved fashion. When microprocessor 110 finds that a transient has occurred, PLC host 845 is so notified.

If PLC host 845 makes no request for the transient data contained in transient data buffer 810, then the sample data from subsequent cycles are permitted to overwrite whatever data is stored in transient data buffer 810. However, if PLC host 845 should make a request for the transient data in transient data buffer 810, then the contents of transient data buffer 810 are sent to transmit buffer 835. The transient data is transmitted from transmit buffer 820 in bursts to PLC host 845 via busses 835 and 840.

In actual practice, to avoid unnecessarily moving data from buffer to buffer, transmit buffer 820, transient data buffer 810 and working data buffer 805 are all the same size and are part of the same memory. Each of buffers 820, 810 and 805 is assigned a starting address or location by microprocessor 110. Thus, should microprocessor need to send the transient data within transient data buffer 810 to transmit buffer 820, then microprocessor 110 redefines the transient data buffer 810 to be the transmit buffer 820 and vice versa. That is, microprocessor 110 now considers the starting address of the transient data buffer 810 to be the starting address of transmit buffer 820. The transient data within transmit buffer 820 is then transmitted in bursts to PLC host 845.

In a similar manner, should PLC host 845 request that microprocessor 110 send host 845 the interleaved working data contained in working data buffer 805, then rather than actually sending the working data to transmit buffer 820 (although this still may be done), microprocessor 110 redefines working data buffer 805 to be transmit buffer 820 and vice versa. More specifically, microprocessor 110 now considers the starting address of the working data buffer 805 to be the starting address of transmit buffer 820. The contents of transmit buffer 820 are then sent in bursts to PLC host 845.

V. Flowchart

Figure 14:
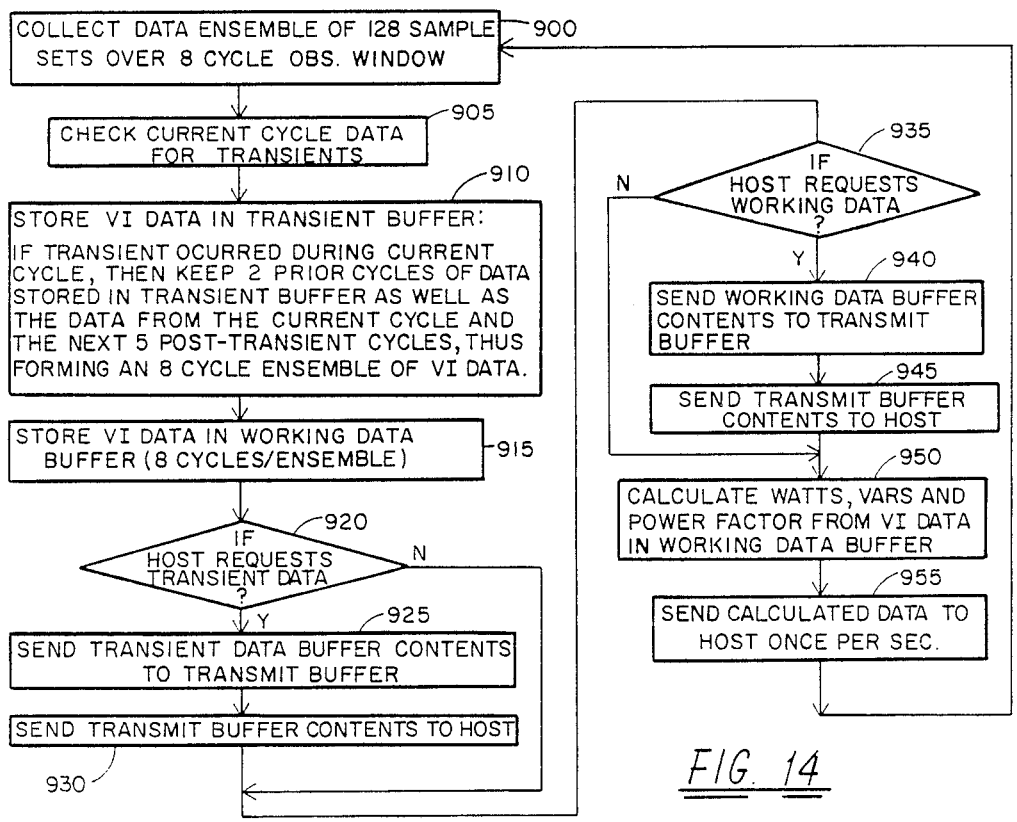
FIG. 14 is a generalized flow chart control program which resides in memory in the power monitor of FIG. 11.

FIG. 14 is a flow chart showing a generalized control program for microprocessor 110. The flow chart of FIG. 14 also summarizes the steps in the process of monitoring power of the present invention.

A data ensemble of 128 sample sets SS1-SS128 each including voltage and current samples is collected over 8 cycles as per block 900. As the current samples of the ensemble are collected, each sample is tested to determine if it is a transient as per block 905. Each ensemble of data is stored in transient buffer 810 as per block 910. That is, if the transient test shows that two successive current samples (for example, a current sample in set SS21 and SS22) exceed a predetermined amplitude, then a transient is determined to exist. Under these conditions, the data from the current cycle as well as the two pre-transient cycles is kept in transient buffer 810. Sample set data from the next 5 post-transient cycles is also stored in transient buffer 810 in non-interleaved fashion to form a complete ensemble of 128 sample sets.

The data from each ensemble is also stored in working data buffer 805 in interleaved fashion as per block 915 in the manner described above. If the host PLC 845 is found to have requested the transient data from transient buffer 810 at decision block 920, then the contents of transient buffer 810 are placed in transmit buffer 820 in block 925. The transient data is sent from transmit buffer 820 to host PLC 845 at block 930. However, if the host PLC 845 is not found to have requested transient data at decision block 920, then flow continues to decision block 935. If host PLC 845 is found to have requested the working data from working data buffer 805 in decision block 935, then the working data from buffer 805 is provided to transmit buffer 820 as per block 940. The working data is sent from transmit buffer 820 to PLC host 845 in block 945. However, if host PLC 845 is not found to have requested the working data at decision block 935, then flow continues to calculation block 950.

At block 950 the WATTS, VARS and POWER FACTOR are calculated by microprocessor 110 from the interleaved working data in working data buffer 805 in the manner already described. The calculated data is sent to host PLC 845 approximately once per second as per block 955. Flow then continues back to block 900 and the process of collecting the next ensemble of data commences. From the above description it is clear that as well as providing power monitoring apparatus, the invention involves a method for monitoring the power associated with a signal. In one embodiment the method includes the the steps of sampling the signal during an observation window including a plurality of cycles of the signal to generate a plurality of voltage-current sample sets during each cycle of the signal, and timing the sampling of the signal such that the sample sets are generated at different relative time positions from cycle to cycle with respect to the beginning of each cycle of the observation window. The method further includes the step of determining from the samples sets the real and imaginary power associated with the signal.

In another embodiment, a method is provided for monitoring power associated with a periodic signal during an observation window including a plurality of cycles of the signal. That method includes the step of taking voltage and current samples during first and second observation windows of the signal to generate a plurality of voltage-current sample sets per cycle of the first and second observation window, and the step of storing the voltage-current sample sets taken during the first observation window in a first memory area. The method further includes the step of analyzing the samples in the first memory area to determine the power associated therewith while during the second observation window storing voltage-current samples taken during the second observation window in a second memory area. The method includes the step of determining if any of the voltage-current samples sets represent transients in the signal and the step of designating one of the first and second memory areas as a transient memory area when transient data is determined to be stored therein. The method further includes storing in a third memory area the sample sets occurring in a next observation window subsequent to an observation window during which a transient was determined to have occurred. The also method includes the step of preventing use of one of the first and second memory areas designated as the transient memory area until the transient data therein is analyzed.

In a preferred embodiment, a method for monitoring the power of a substantially periodic signal is provided including the step sampling the signal during an observation window including a plurality of cycles of the signal to generate a plurality of voltage-current sample sets. Each sample set contains at least one voltage sample and at least one current sample taken substantially at the same time. The method further includes the step of timing the sampling of the signal such that the voltage-current sample sets are distributed throughout each cycle of the observation window. The method also includes the step of storing in interleaved fashion in a first memory area the sample sets occurring during a particular observation window so as to simulate a single cycle of data in the first memory area, and the step of storing in sequential fashion in a second memory area the sample sets occurring during the particular observation window.

The foregoing describes a power monitor and a method for monitoring power which are capable of determining the WATTS (real power) and VARS (volt-amps reactive or imaginary power) associated with a particular power line. The power monitor includes data acquisition circuitry uniquely configured such that the speed requirement thereof is relatively low. The power monitor collects a data base of waveform information for the purpose of conducting waveform analysis and permitting transient analysis/display of transient data. The power monitor provides true RMS voltage and current on a per phase basis and system power factor and total energy on a system basis.

While only certain preferred features of the invention have been shown by way of illustration, many modifications and changes will occur to those skilled in the art. It is to be understood that the present claims are intended to cover all such modifications and changes which fall within the true spirit of the invention.

I claim:

1. A power monitor for monitoring power associated with a periodic signal comprising:
    sampling means for sampling said signal during an observation window, said window including a plurality of cycles of said signal, to generate a plurality of voltage-current sample sets; and
    timing means, coupled to said sampling means, for timing the sampling of said signal such that said voltage-current sample sets are distributed in time at different time positions from cycle to cycle within said observation window relative to the beginning of each cycle.

2. A power monitor for monitoring power associated with a periodic signal comprising:
    sampling means for sampling said signal during an observation window, said window including a plurality of cycles of said signal, to generate a plurality of voltage-current samples sets; and
    timing means, coupled to said sampling means, for timing the sampling of said signal such that a non-integer number of sample sets are taken per cycle so that from cycle to cycle within said observation window said voltage-current sample sets are taken at different relative time positions with respect to the beginning of each cycle of said observation window.

3. A power monitor for monitoring power associated with a periodic signal during an observation window, said window including a plurality of cycles of said signal, said method comprising:
    timing means for dividing each cycle time of said signal into a plurality of time intervals;
    sampling means, coupled to said timing means, for taking voltage and current samples during each of said time intervals to generate a plurality of voltage-current sample sets during each cycle of said observation window, said voltage-current sample sets being generated at different time positions during each cycle of said signal relative to the beginning of each cycle of said signal;
    memory means, coupled to said sampling means, for storing said voltage-current sample sets; and
    microprocessor means, coupled to said memory means, for determining the real and imaginary power associated with said signal from the sample sets stored in said memory means.

4. A power monitor for monitoring power associated with a periodic line signal having a plurality of cycles comprising:
    reference signal generating means, synchronized in frequency and phase with said line signal, for generating a reference signal which is a multiple of said line signal and which exhibits an integer number of pulses for each cycle of said line signal;

sampling means for sampling said line signal at a selected sampling frequency during an observation window, said window including a plurality of cycles of said line signal, to generate a plurality of voltage-current samples sets during each cycle of said line signal, said sampling means having a plurality of outputs at which samples are held respectively, each of said sample sets including at least one voltage sample and at least one current sample;

divider means, coupled between said reference signal generating means and said sampling means, for dividing said reference signal down to determine said selected sampling frequency such that from cycle to cycle within said observation window said voltage-current sample sets are distributed in time at different time positions relative to the beginning of each cycle;

multiplexing means, coupled to the plurality of outputs of said sampling means, for multiplexing the samples within each sample set at the outputs of said sampling means by sequentially providing said samples to an output of said multiplexing means, thus generating a multiplexed sample signal;

analog to digital converter means, coupled to the output of said multiplexing means, for converting said multiplexed sample signal to a digital sample signal; and microprocessor means, coupled to said analog to digital converter means, for processing said digital sample signal to determine the real and imaginary power associated with said line signal during said observation window.

5. The power monitor of claim 4 wherein said reference signal generating means includes a phase lock loop multiplier.

6. A power monitor for monitoring power associated with a periodic line signal over a plurality of cycles comprising:

first, second and third memory areas;

sampling means for sampling voltage and current of said line signal over a plurality of observation windows to generate incoming sample data, an observation window including a predetermined number of cycles of said line signal;

means for alternatingly storing incoming sample data in said first and second memory areas during respective sequential observation windows;

microprocessor means, coupled to said first, second and third memory areas, for performing analysis on the sample data stored in said first memory area while incoming sample data is being stored in said second memory area, said microprocessor means subsequently performing analysis on the sample data stored in said second memory area while incoming sample data is being stored in said first memory area; and transient sensing means for determining if sample data in a present observation window contains transient data and, if so, causing incoming sample data in a next observation window following said present observation window to be stored in said third memory area.

7. The power monitor of claim 6 including means for selectively preventing storage of incoming sample data in one of said first and second memory areas if said one of said first and second memory areas contains transient data.

8. The power monitor of claim 7 including means for permitting incoming sample data to be stored in said one of said first and second memory areas which contained transient data after the transient data therein has been analyzed.

9. A method of monitoring power associated with a periodic signal comprising the steps of:

sampling said signal during an observation window including a plurality of cycles of said signal to generate a plurality of voltage-current sample sets during each cycle of said signal; and timing the sampling of said signal such that said sample sets are generated at different relative time positions from cycle to cycle with respect to the beginning of each cycle of said observation window.

10. The method of claim 9 wherein power is monitored on a plurality of line phases and including the step of determining from said sample sets a true RMS voltage and current in selected ones of the line phases.

11. The method of claim 9 including the step of:

determining from said sample sets the real and imaginary power associated with said signal.

12. The method of claim 11 wherein said determining step includes determining the real power exhibited by said signal during said observation window according to the relationship:

$$\text{WATTS} = \frac{1}{M} \sum_{i=0}^{119} V(i)I(i)\cos(\theta)$$

wherein WATTS is real power, V(i) represents each voltage sample within the observation window, I(i) cos ($\theta$) represents each current sample within the observation window, and M represents the number of samples in said observation window.

13. The method of claim 11 wherein said determining step includes determining the imaginary power exhibited by said signal during said observation window according to the relationship:

$$\text{VARS} = \frac{1}{M} \sum_{i=1}^{119} V(i)I(i)\cos(\theta + 90)$$

wherein VARS is the volts-amps reactive, V(i) represents each voltage sample within said observation window, I(i) cos ($\theta$+90) represents each current sample offset by 90 degrees within said observation window, and M represents the number of samples in said observation window.

14. The method of claim 13 and including the step of determining system power factor.

15. The method of claim 14 and including the step of determining total system energy usage.

16. A method of monitoring power associated with a periodic signal during an observation window, said window including a plurality of cycles of said signal, said method comprising the steps of:

dividing each cycle into a plurality of time intervals having substantially equal duration;

taking voltage and current samples during each of said time intervals of each of said cycles to generate voltage-current sample sets at different relative time positions from cycle to cycle of said signal with respect to the beginning of each cycle of said observation window;

storing said voltage-current sample sets in a memory; and determining the real and imaginary power associated with said signal from the samples thus stored.

17. The method of claim 16 wherein said plurality of time intervals per cycle of said observation window is a non-integer number.

18. A method of monitoring power associated with a periodic signal during an observation window, said window including a plurality of cycles of said signal, said method comprising the steps of:
taking voltage and current samples during first and second observation windows of said signal to generate a plurality of voltage-current sample sets per cycle of said first and second observation window;
storing the voltage-current sample sets taken during said first observation window in a first memory area;
analyzing the samples in said first memory area to determine the power associated therewith while during said second observation window storing voltage-current samples taken during said second observation window in a second memory area;
determining if any of said voltage-current samples sets represent transients in said signal;
designating one of said first and second memory areas as a transient memory area when transient data is determined to be stored therein;
storing in a third memory area the sample sets occurring in a next observation window subsequent to an observation window during which a transient was determined to have occurred; and
preventing use of one of said first and second memory areas designated as said transient memory area until the transient data therein is analyzed.

19. The method of claim 18 including the step of interchanging the functions of said first and second memory areas during an third observation window subsequent to said second observation window such that sample-sets taken during said third observation window are stored in said first memory area while sample-sets in said second memory area are analyzed to determine the power associated therewith.

20. The method of claim 18 including the step of conducting a transient analysis of the voltage samples in said transient memory area when transient data is stored in such memory area.

21. The method of claim 20 including the step of permitting storage of voltage-current sample sets in said transient memory area after the transient data therein has been analyzed.

22. A power monitor for monitoring power associated with a periodic signal comprising;
sampling means for sampling said signal during an observation window, said window including a plurality of cycles of said signal, to generate a plurality of voltage-current sample sets, each sample set containing at least one voltage sample and at least one current sample taken substantially at the same time;
timing means, coupled to said sampling means, for timing the sampling of said signal by said sampling means such that said voltage-current sample sets are distributed throughout each cycle of said observation window;
a working data memory area, coupled to said sampling means, for storing the sample sets occurring during an observation window in interleaved fashion to simulate a single cycle of data; and a transient data area, coupled to said sampling means, for storing the sample sets occurring during an observation window in sequential fashion.

23. The power monitor of claim 22 including a transmit data memory area, coupled to said working data area and said transient data memory area, for storing the contents of a selected one of said working data memory area and said transient data memory area as instructed in preparation for transmission of the data thus stored in said transmit data memory area to another location.

24. The power monitor of claim 22 including means for redefining said working data memory area to be said transmit memory area and said transmit data memory area to be said working data memory area when it is desired to transmit the contents of said working data memory to another location.

25. The power monitor of claim 22 including testing means, coupled to said sampling means, for determining if a cycle of said observation window contains a transient.

26. The power monitor of claim 25 wherein said testing means determines that a transient has occurred within a particular cycle of said observation window when at least two successive current samples in the voltage-current sample sets of said particular cycle exhibit an amplitude which is greater than a predetermined threshold level.

27. The power monitor of claim 22 including microprocessor means, coupled to said sampling means and said memory means, for determining the real and imaginary power associated with said signal from the samples stored in said working data memory area.

28. The power monitor of claim 27 including a calculated data memory area, coupled to said microprocessor means, for storing the real and imaginary power determined by said microprocessor means for each cycle of said signal.

29. A method for monitoring power of a substantially periodic signal comprising the steps of:
sampling said signal during an observation window, said window including a plurality of cycles of said signal, to generate a plurality of voltage-current sample sets, each sample set containing at least one voltage sample and at least one current sample taken substantially at the same time;
timing the sampling of said signal such that said voltage-current sample sets are distributed throughout each cycle of said observation window;
storing in interleaved fashion in a first memory area the sample sets occurring during a particular observation window so as to simulate a single cycle of data in said first memory area; and
storing in sequential fashion in a second memory area the sample sets occurring during said particular observation window.

30. The method of claim 29 including the steps of
storing in a third memory area the contents of said first memory area when the contents of said first memory area are desired to be provided to an output; and
storing in said third memory area the contents of said second memory area when the contents of the second memory area are desired to be provided to said output.

31. The method of claim 30 including the step of redefining said first memory area to be said third memory area when the contents of said first memory area are desired to be provided to said output.

32. The method of claim 30 including the step of redefining said second memory area to be said third memory area when the contents of said second memory area are desired to be provided to said output.

* * * * *